United States Patent [19]

Ohsawa

[11] Patent Number: 4,731,529
[45] Date of Patent: Mar. 15, 1988

[54] LIGHT MEASURING CIRCUIT HAVING CIRCUITRY FOR BYPASSING A LOW FREQUENCY COMPONENT IN THE OUTPUT OF A PHOTOELECTRIC CONVERSION ELEMENT

[75] Inventor: Toshifumi Ohsawa, Kanagawa, Japan
[73] Assignee: Canon Kabushiki Kaisha
[21] Appl. No.: 847,204
[22] Filed: Apr. 2, 1986
[30] Foreign Application Priority Data Apr. 3, 1985 [JP] Japan .................... 60-067904

[51] Int. Cl.$^4$ ............................. H01J 40/14
[52] U.S. Cl. .................... 250/214 A; 330/290; 330/308; 250/214 RC
[58] Field of Search ............. 330/290, 259, 59, 308; 250/206, 214 A, 214, 214 RC; 356/226

[56] References Cited

U.S. PATENT DOCUMENTS

| 3,872,329 | 3/1975 | Dodson, III | 250/214 R |
| 4,498,001 | 2/1985 | Smoot | 250/214 A |
| 4,626,677 | 12/1986 | Browne | 250/214 A |
| 4,636,053 | 1/1987 | Sakane et al. | 250/214 A |

OTHER PUBLICATIONS

"Transresistance Photoamplifier with DC and Low-Frequency Notching Capability", by Burke Motorola Tech. Dis. Bull., vol. 1, No. 1, Aug. 1980, pp. 18–19.

Primary Examiner—David C. Nelms
Assistant Examiner—Chung Seo
Attorney, Agent, or Firm—Toren, McGeady & Associates

[57] ABSTRACT

A light measuring circuit, consisting of an amplifying circuit amplifying the output of a photoelectric conversion element, is arranged to detect the occurrence of a low frequency component in the output of the photoelectric conversion element that comes to exceed a given level and, upon detection of that, to bypass the output of the photoelectric conversion element to prevent the output of the amplifying circuit from being saturated by a DC light (external or ambient light).

5 Claims, 8 Drawing Figures

PRIOR ART FIG.1
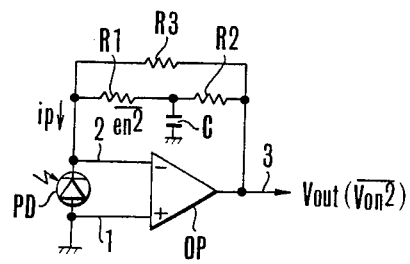
PRIOR ART FIG.2
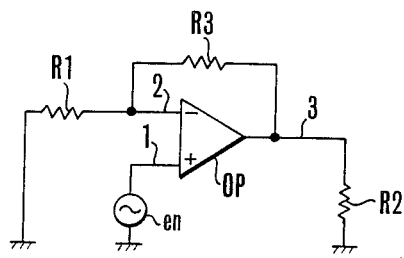
FIG.3
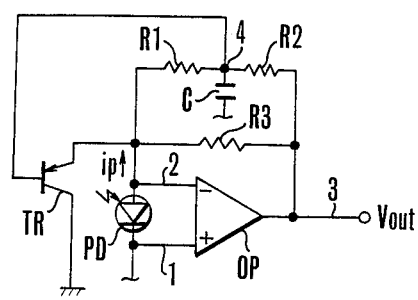

LIGHT MEASURING CIRCUIT HAVING CIRCUITRY FOR BYPASSING A LOW FREQUENCY COMPONENT IN THE OUTPUT OF A PHOTOELECTRIC CONVERSION ELEMENT

BACKGROUND OF THE INVENTION

1. Field of the Invention

This invention relates to a light measuring circuit consisting of a photocurrent amplifying circuit which amplifies a current produced from a photoelectric conversion element and, more particularly, to a circuit which prevents the output of the photocurrent amplifying circuit from being saturated by a DC component.

2. Description of the Prior Art

Known photocurrent amplifying circuits includes a circuit which excels in linearity and responsivity and is capable of detecting a weak, relatively high frequency pulse-like light signal coming under an ambient light (external light) which extensively varies in a DC-like manner or at a low frequency (flicker). Unlike the photo-current amplifying circuits used for optical communication devices of pulse code modulation (PCM) systems, optical character readers, etc., the photocurrent amplifying circuit of this kind has been arranged, for example, as shown in FIG. 1 of the accompanying drawings.

The amplifying circuit shown in FIG. 1 has a negative feedback loop which includes a parallel connection circuit, formed by a T type low-pass filter circuit consisting of resistors R1 and R2 and a capacitor C having one terminal connected to a node between the resistors R1 and R2 and the other terminal grounded, and a gain limiting resistor R3 of a high resistance value disposed in between the output terminal 3 and the inverting input terminal 2 of an operational amplifier OP which has a high input impedance and has its non-inverting input terminal 1 grounded. A photoelectric conversion element PD (photogalvanic element), such as a photodiode which receives the light signal mentioned above, is connected between the input terminals 1 and 2 of the operational amplifier OP. The signal is taken out in the form of a photocurrent. The light signal is thus detected in a state of having good linearity over a wide range.

With the amplifying circuit arranged in this manner, assuming that the output current of the photoelectric conversion element PD, i.e. the photocurrent, is expressed as ip, the output voltage Vout of the amplifying circuit can be generally expressed as:

$$V_{out} = \left\{ \frac{Jwc\ R1R2 + (R1 + R2)}{Jwc\ R1R2 + (R1 + R2 + R3)} \right\} \cdot R3 \cdot ip \quad (1)$$

In a low frequency region of $\omega \approx 0$ in particular, the output voltage becomes:

$$V_{out} = \frac{R1 + R2}{R1 + R2 + R3} \cdot R3 \cdot ip \cong (R1 + R2) \cdot ip \quad (2)$$

In a frequency region which is expressed as $$\omega >> \frac{R1 + R2 + R3}{CR1 \cdot R2},$$

it can be expressed as follows:

$$V_{out} = R3 \cdot ip \quad (3)$$

As will be understood from Formula (2) above, in the low frequency region, the output of the amplifying circuit is determined by the sum (R1+R2) of the resistance values of the resistors R1 and R2. In a high frequency region, the amplifying circuit output is determined by the value of the resistor R3 as will be understood from Formula (3) above. Therefore, with the resistance value of the resistor R3 arranged to be a large value and the sum (R1+R2) of the resistance values of the resistors R1 and R2 arranged to be small, the signal component representing the ambient light can be suppressed while a signal component of a given frequency, representing a signal light to be handled, can be emphatically taken out. However, in the amplifying circuit arranged in this manner, the provision of T type low-pass filter circuit, consisting of the resistors R1 and R2 and the capacitor C in the negative feedback loop, causes a noise component generated at the operational amplifier OP to be also amplified. Compared with an arrangement having the resistor R3 solely included in the negative feedback loop of the operational amplifier OP, the noise component in the signal becomes larger. This results in a salient deterioration of the S/N ratio of the whole amplifying circuit.

Assuming that an operational amplifier having an FET input terminal is employed as the operational amplifier OP and that a current noise and a thermal noise are negligible, with a noise voltage which arises at the inverting input terminal 2 of the operational amplifier OP assumed to be $\overline{en^2}$, a noise voltage $\overline{Von^2}$ which arises at the output terminal 3 is expressed as follow:

$$\overline{Von^2} = \left| \frac{Jwc\ (R1R2 + R2R3) + (R1 + R2 + R3)}{Jwc\ R1R2 + (R1 + R2 + R3)} \right|^2 \cdot \overline{en^2} \quad (4)$$

In the low frequency region of $\omega \approx 0$, the noise voltage becomes as expressed below:

$$\overline{Von^2} \approx \overline{en^2} \quad (5)$$

Further, in the high frequency region of $\omega \approx \infty$, it becomes:

$$\overline{Von^2} = \left(1 + \frac{R3}{R1}\right)^2 \cdot \overline{en^2} \quad (6)$$

In other words, in a given frequency region, the noise is increased by (1+(R3/R1)) times because of AC amplification as compared with an arrangement having the resistor R3 solely provided in the negative feedback loop of the operational amplifier OP.

This is further explained with reference to FIG. 2. FIG. 2 shows an AC circuit equivalent to the photocurrent amplifying circuit of FIG. 1. For an AC component, the impedance of the capacitor C is negligible. Therefore, the T type low-pass filter of FIG. 1 does not function as a filter and is considered equivalent to an arrangement having the resistor R1 connected between the inverting input terminal 2 of the operational amplifier OP and a grounding point as shown in FIG. 2. Further, the resistor R2 is equivalent to an arrangement having it connected as a load resistor between the output terminal of the amplifier OP and a grounding point. In FIG. 2, a reference symbol en denotes an equivalent voltage source reducing the input of noise generated by the operational amplifier OP by itself. However, in the case of a feedback arrangement, the non-inverting input terminal 1 and the inverting input terminal 2 have equal potentials. Therefore, with a bias current flowing to the inverting input terminal 2 of the operational amplifier OP not taken into consideration, the noise voltage en appears at the output terminal 3 of the operational amplifier OP in a state of having been amplified by the resistance value ratio between the resistors R1 and R3. It will be qualitatively understood that the noise component thus increases.

In order to prevent the output of the amplifying circuit from being saturated by the DC photocurrent resulting from an ambient light with the conventional photocurrent amplifying circuit arranged as shown in FIG. 1, a DC removing ratio $\gamma = (R1+R2)/R3$ should be arranged to be sufficiently small. However, the degree of noise amplification becomes too large for handling a weak signal. Therefore, there is a reducible limit to the DC removing ratio. Hence, the values of the resistors R1, R2 and R3 are generally determined according to a compromising point between a DC removing ration and a noise amplifying degree. As a result, it has been a drawback of the conventional arrangement that both the DC removing ratio and the noise amplifying degree become inadequate. To solve this problem, in cases where the above-stated amplifying circuit is to be used, it has been necessary to have another circuit or an optical system arranged to perform an additional function of compensating for the inadequacy of the DC removing ratio or the noise amplifying degree.

SUMMARY OF THE INVENTION

This invention is directed to the solution of the above-stated problems of the prior art. It is therefore an object of this invention to provide a photocurrent amplifying circuit which is provided with means operating according to the level of the low frequency component of the output of a photoelectric conversion element and is arranged to absorb the low frequency component of a signal corresponding to the output of the photoelectric conversion element by this means.

The above and further objects and features of this invention will become apparent from the following detailed description of preferred embodiments thereof taken in connection with the accompanying drawings.

BRIEF DESCRIPTION OF THE DRAWINGS

FIG. 1 is a circuit diagram showing a photocurrent amplifying circuit as an example of the prior art.

FIG. 2 is a circuit diagram showing an AC equivalent circuit which is equivalent to the circuit of FIG. 1.

FIG. 3 is a circuit diagram showing a first embodiment example of this invention.

DETAILED DESCRIPTION OF THE PREFERRED EMBODIMENTS

Figure 4:
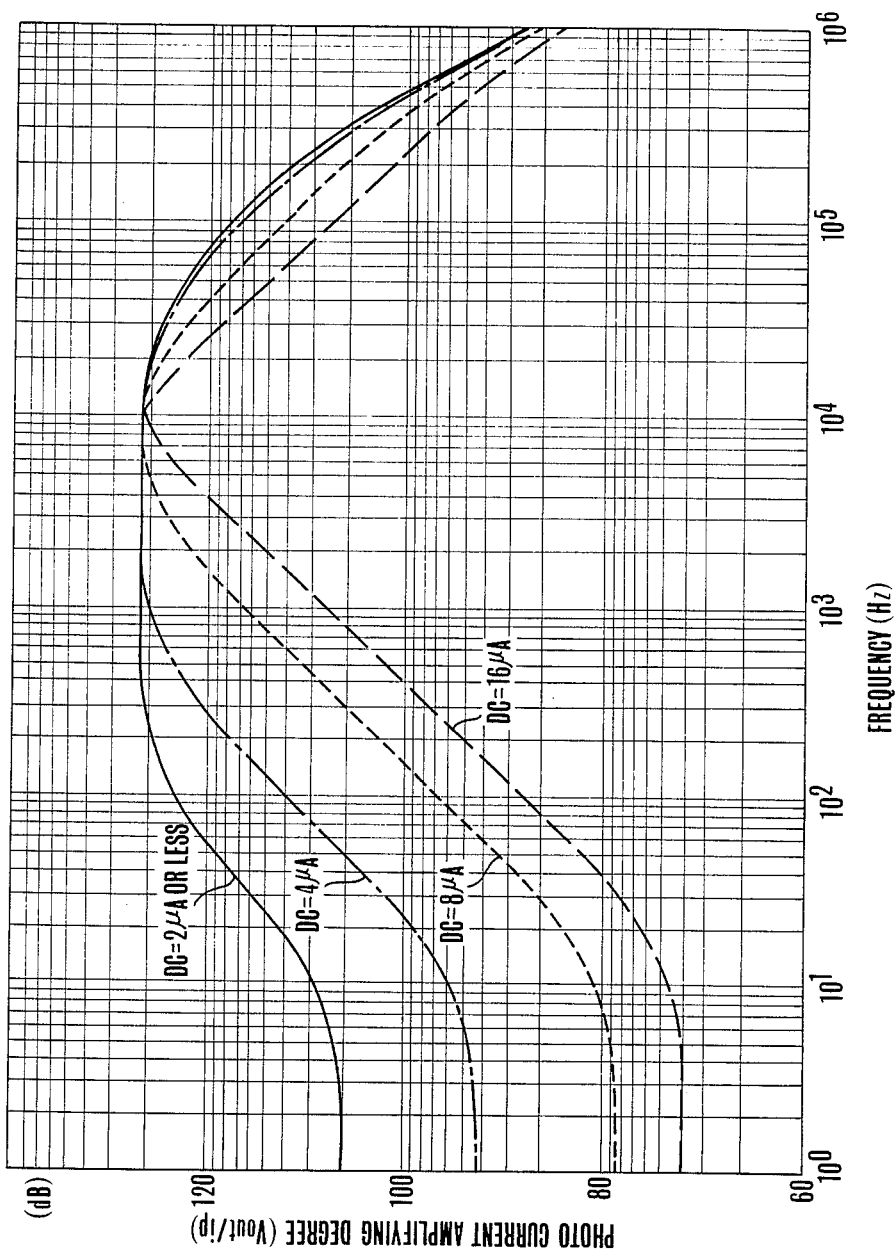
FIG. 4 is a graph showing the frequency characteristic of the circuit of the first embodiment example.

FIG. 3 shows in a circuit diagram a first embodiment example of this invention. The embodiment includes a T type low-pass filter which is formed by resistors R1 and R2 and a capacitor C arranged in the negative feedback loop of an operational amplifier OP in the conventional manner. To this conventional circuit arrangement is added a DC current absorbing transistor TR which has the base thereof connected to a node 4 between the resistors R1 and R2.

The photocurrent amplifying circuit shown in FIG. 3 operates as follows: In the case of the conventional circuit shown in FIG. 1, the amplifying degree for the DC (or low frequency) component of a photocurrent ip and the amplifying degree for the signal (high frequency) component of the photocurrent ip are determined solely by the resistance value of the negative feedback loop as indicated by Formulas (2) and (3). In the first embodiment example of this invention shown in FIG. 3, however, the transistor TR acts to change the gain for a low frequency current. In the event that the photocurrent ip consists solely of an AC component including no low frequency component, the photocurrent ip flows via the resistor R3 to the output terminal of the operational amplifer OP to give an AC output voltage $Vout = R3 \cdot ip$ in the same manner as the conventional circuit. For the AC component, there is no feedback by the T type filter with the capacitor C assumed to be short-circuited. Therefore, in that event, there is no difference between the potentials of the base and emitter of the transistor TR as no voltage drop is caused by the resistor R1. The transistor TR thus remains inoperative. Therefore, the conventional circuit operation as described in the foregoing with reference to Formulas (1) to (3) applies. The same condition also obtains in cases where only small amount of a low frequency current is included in the photocurrent ip and the voltage drop due to the resistor R1 is not large enough to render the transistor TR operative. In other words, as long as the voltage drop of the resistor R1 (a drop in the voltage applied between the base and emitter of the transistor TR) due to the low frequency component of the photocurrent ip remains below a value (generally 0.6 V or thereabout) required for rendering the transistor TR operative, the circuit arrangement of this embodiment operates in exactly the same manner as the operation of the conventional circuit.

In case that the low frequency component of the photocurrent ip is large enough to have the resistor R1 bring about a sufficient voltage drop VBE for rendering the transistor TR operative, the embodiment operates as follows:

When a voltage larger than 0.6 V is applied between the base and emitter of the transistor TR as a result of an increase in the low frequency component of the photo current ip, a portion of the photocurrent ip flows between the emitter and collector of the transistor TR and the low frequency component of the photocurrent ip flowing to the resistor R1 is bypassed. Then, even if the low frequency component of the photocurrent ip generated at the photodiode PD increases and comes to try to increase the photocurrent flowing to the resistor R1, the transistor acts to have a current flow between its emitter and collector in a larger amount. As a result, a portion of the low frequency component of the photocurrent ip which is flowing to the negative feedback loop of the operational amplifier OP becomes a value obtained by dividing the voltage (0.6 to 0.8 V or thereabout) by the resistance value of the resistor R1 and the amount of the current flowing to the negative feedback loop is not increased by the increase of the low frequency component of the photocurrent ip. Therefore, if the value of the voltage BVE between the base and emitter of the transistor TR is arranged to be 0.8 V, the portion of the current flowing to the resistor R1 becomes 0.8/R1 (A) while the rest of the DC current flows to the emitter of the transistor TR. Therefore, the degree of voltage change which appears in the output Vout of the photocurrent amplifying circuit due to the DC current, is limited and does not come to exceed $$\frac{0.8}{R1}(R1 + R2),$$

so that the output can be effectively prevented from being saturated by the DC current.

FIG. 4 shows in a graph an example of the frequency characteristic of the gain of the photocurrent amplifying circuit arranged according to this invention as shown in FIG. 3. In this example, the constants as follows: R1=180 KΩ; R2=39 KΩ, R3=2.2 MΩ and C=0.47 μF. The frequency characteristic is arranged to be such that the gain becomes a maximum value at 10 KHz to make the circuit most suited for receiving a signal light modulated by a frequency of 10 KHz. In the case of this graph, when the DC current included in the photocurrent ip is less than 2 μA, the transistor TR does not operate and the frequency characteristic is determined solely by the T type filter. However, as shown, the transistor TR operates to further suppress the gain for the DC light while keeping the gain for the signal light unvarying as the DC current increases to 4 μA, 8 μA and 16 μA.

Figure 5:
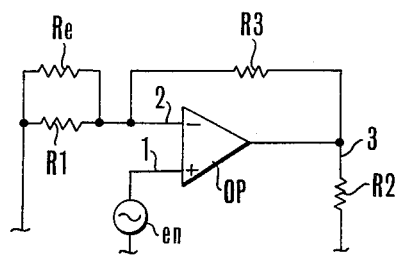
FIG. 5 is a circuit diagram showing an AC equivalent to the circuit of FIG. 3.

The noise amplifying degree of this circuit is as follows: FIG. 5 shows an AC equivalent circuit equivalent to the photocurrent amplifying circuit arranged according to this invention as shown in FIG. 3. The circuit of FIG. 5 differs from the conventional circuit example of FIG. 2 in that there is added a resistor Re. This resistor Re corresponds to a resistor between the base and emitter of the transistor TR of the circuit shown in FIG. 3. Assuming that the collector current of the transistor TR is Ic, the resistor Re can be expressed as shown below:

$$Re = \frac{kT/q}{Ic} \approx \frac{25.9 \text{ mV}}{Ic} \quad (7)$$

wherein k represents a Boltzmann constant; T absolute temperature; and q elementary charge, respectively.

Therefore, in the case of this embodiment arranged as shown in the block diagram, the resistance value of the resistor Re becomes smaller, accordingly, as the amount of a current flowing to the transistor TR increases with the voltage drop increased at the resistor R1 due to a larger DC component of the photocurrent ip. Conversely, the voltage drop at the resistor R1 decreases, accordingly, as the DC component becomes smaller. When the transistor TR thus becomes inoperative, the resistance value of the resistor Re comes close to an infinity value. The noise amplifying degree of the circuit of this embodiment can be expressed, like in the case of the foregoing description of the prior art, by the following formula:

$$\overline{Von^2} = \left(1 + \frac{R3}{R1//Re}\right)^2 \cdot \overline{en^2} \quad (8)$$

In Formula (8) above, R1 ∥ Re represents the parallel resistance values of the resistors R1 and Re. Therefore, the noise amplifying degree of the circuit of this embodiment becomes a minimum value when the transistor TR is inoperative with the DC component of the photocurrent ip being at a small amount. When the DC component reaches a region of rendering the transistor TR operative, the resistance value of the resistor Re decreases and the noise amplifying degree increases, accordingly, as the current flowing to the transistor TR increases. As mentioned in the foregoing, the circuit of this embodiment is capable of effectively preventing the saturation of the output due to the DC current by virtue of the action of the transistor TR. Therefore, compared with the conventional circuit arrangement whereby the DC current is suppressed solely by means of the T type low-pass filter, the circuit arrangement of this embodiment permits the resistors R1 and R2 of the T type filter part to have larger resistance values. Such being the arrangement, even in cases where the transistor TR remains inoperative, the noise amplifying degree of the circuit can be suppressed to a smaller value than the conventional arrangement by increasing the resistance value of the resistors R1 and R2 of the T type low-pass filter, so that the S/N ratio can be improved to a great extent. When the DC component enters the region of rendering the transistor TR operative, the noise amplifying degree increases to deteriorate the S/N ratio. However, in cases where the circuit of this embodiment is applied to the signal processing circuit of the light receiving circuit in the automatic focusing device of a still picture camera or a video camera, the ambient conditions for the operation are greatly varying. Particularly, where an intense ambient light causes a great amount of DC current to flow from the photodiode of the light receiving circuit, the phototaking lens of the camera is stopped down. This gives a deeper depth of field to allow a certain degree of deterioration in the precision of the automatic focusing operation. Therefore, with the resistance values of the resistors R1, R2 and R3 of the negative feedback loop determined in such a way as to allow the transistor TR to operate only under the most unfavorable conditions where the ambient light other than a signal light is extremely intense. Such arrangement mitigates the fear of a deteriorated S/N ratio. Meanwhile, the fact that the S/N ratio can be improved under a normal condition under which the transistor TR remains inoperative gives a great advantage.

Figure 6:
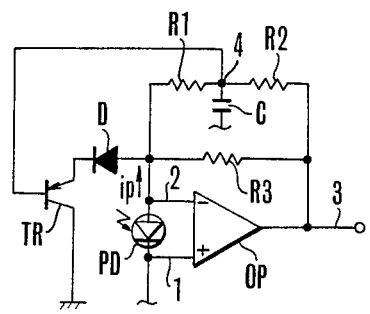
FIG. 6 is a diagram showing the circuit arrangement of a second embodiment example of this invention.

FIG. 6 shows in a circuit diagram a second embodiment example of this invention. The second example differs from the first example shown in FIG. 3 in that a diode D is connected between the inverting input terminal 2 of the operational amplifier OP and the emitter of the transistor TR. In the first embodiment example, the transistor TR comes to operate when the voltage drop of the resistor R1 due to the DC current exceeds 0.6 V or thereabout. Whereas, with the diode D connected to the emitter of the transistor TR in the case of the second example, the voltage drop is furthered by the diode D. Therefore, the transistor TR does not come to operate until the voltage drop at the resistor R1 comes to exceed 1.2 V or thereabout. The arrangement of the second embodiment example is advantageous in cases where the conditions of a system using the photocurrent amplifying circuit, such as power supply voltage, etc., have a relatively greater allowance permitting the output voltage variations of the amplifying circuit due to the DC current up to a value between 1.2 V and 1.6 V or thereabout. In that case, the operating range of the transistor TR is limited within a range of much greater DC currents. The resistor R1 is allowed to have a relatively large resistance value to suppress the noise amplifying degree when the transistor TR remains within its non-operating range.

Figure 7:
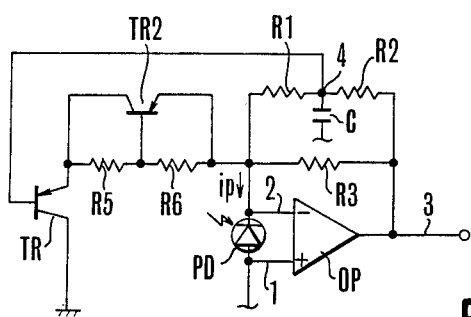
FIG. 7 is a diagram showing the circuit arrangement of a third embodiment example of this invention.

The concept of the second embodiment example is furthered in a third embodiment example which is arranged as shown in FIG. 7. In the case of the third example, the transistor TR is arranged to become operative when the voltage drop at the resistor R1 due to the low frequency component of the photocurrent ip comes to exceed a value (2+R5/R6) VBE with the voltage drop value between the base and emitter of the transistor TR assumed to be about equal to the voltage drop value between those of another transistor TR2 and with that value expressed as BVE. The value of the DC current at which the transistor TR enters the operating range is freely adjustable not only to a value which is an integer number of times as large as the value BVE (diode voltage) but also to any other value by suitably selecting the resistance values of resistors R5 and R6.

Figure 8:
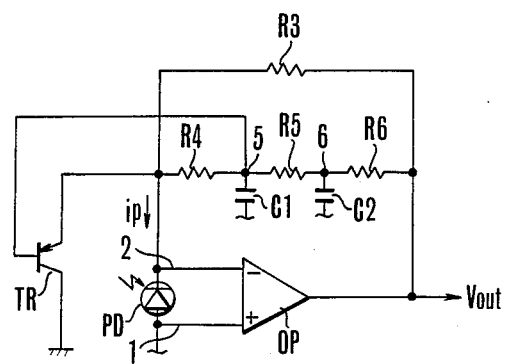
FIG. 8 is a diagram showing the circuit arrangement of a further embodiment example of this invention.

In each of the embodiment examples given in the foregoing, the T type low-pass filter is arranged in the negative feedback loop of the operational amplifier OP. Whereas, in the case of another embodiment example shown in FIG. 8, a circuit consisting of two stages of serially connected T type low-pass filters is inserted in the negative feedback loop of the operational amplifier OP. In this instance, the base of the transistor TR may be either connected to a node 5 between resistors R4 and R5, as shown in FIG. 8, or connected to a node 6 between resistors R5 and R6. However, with the base of the transistor TR connected to the node 5 between the resistors R4 and R5 as shown in FIG. 8, the characteristic of the low-pass filter becomes steeper than connecting it between the resistors R5 and R6.

In accordance with this invention as described in the foregoing, the low frequency component of a signal corresponding to the output of the amplifying circuit amplifying the photocurrent produced from a photoelectric conversion element is bypassed according to the level of the low frequency component included in the output of the amplifying circuit. Therefore, the output of the photocurrent amplifying circuit can be prevented from being saturated by an ambient light component. The invention thus enhances the precision of the operation of a light measuring current.

What is claimed is:

1. A DC signal suppression circuit for a photo-signal amplifying circuit using an operational amplifier, comprising:
   (a) photoelectric conversion means;
   (b) a parallel circuit consisting of an operational amplifier having an input terminal connected to said photoelectric conversion means, a T type low-pass filter disposed in a negative feedback loop of said operational amplifier, and a resistor; and
   (c) bypass switching means connected to a contact point between a resistor and a capacitor of said T type low-pass filter, said bypass switching means turning on to bypass a photocurrent from the photoelectric conversion means when a value of a current flowing through the contact point becomes higher than a predetermined value.

2. A circuit according to claim 1, wherein said bypass switching means is composed of a transistor, which has a base thereof connected to a voltage dividing point between resistors forming said T type low-pass filter.

3. A DC signal suppression circuit for a photo-signal amplifying circuit using an operational amplifier, comprising:
   (a) an operational amplifier;
   (b) a light receiving element connected between inputs of said operational amplifier;
   (c) a low-pass filter circuit, composed of a resistor and a capacitor, connected in a feedback path of said operational amplifier;
   (d) a resistor connected in parallel to said low-pass filter circuit; and
   (e) a bypass circuit which turns on to bypass a photoelectric current generated in said light receiving element when a value of a photoelectric current flowing through the resistor of said low-pass filter circuit becomes higher than a predetermined value.

4. A DC signal suppression circuit according to claim 3, wherein said low-pass filter circuit is a T type low-pass filter.

5. A DC signal suppression circuit according to claim 3, wherein said bypass circuit is composed of a transistor.

* * * * *